United States Patent
Hsieh et al.

(10) Patent No.: US 9,035,808 B2
(45) Date of Patent: May 19, 2015

(54) COMMUNICATION SYSTEM AND SAMPLE RATE CONVERTER THEREOF

(71) Applicant: MStar Semiconductor, Inc., Hsinchu Hsien (TW)

(72) Inventors: Ming-Yu Hsieh, Chupei (TW); Shih-Chieh Yen, Chupei (TW); Khurram Muhammad, Winston Salem, NC (US)

(73) Assignee: MStar Semiconductor, Inc., Hsinchu Hsien (TW)

( * ) Notice: Subject to any disclaimer, the term of this patent is extended or adjusted under 35 U.S.C. 154(b) by 0 days.

(21) Appl. No.: 14/283,301

(22) Filed: May 21, 2014

(65) Prior Publication Data

US 2014/0361913 A1  Dec. 11, 2014

Related U.S. Application Data

(60) Provisional application No. 61/831,150, filed on Jun. 5, 2013.

(30) Foreign Application Priority Data

Aug. 26, 2013  (TW) .............................. 102130468 A (51) Int. Cl.
*H03M 7/00* (2006.01)
*H03M 1/66* (2006.01)
*H03M 3/00* (2006.01)

(52) U.S. Cl.
CPC *H03M 1/66* (2013.01); *H03M 3/30* (2013.01); *H03M 3/496* (2013.01); *H03M 3/498* (2013.01)

(58) Field of Classification Search
CPC ............................. H03M 3/496; H03M 3/498
USPC .......................................... 341/61, 67; 700/94
See application file for complete search history.

(56) References Cited

U.S. PATENT DOCUMENTS

| 7,574,274 B2 * | 8/2009 | Holmes ........................... 700/94 |
| 8,089,377 B2 * | 1/2012 | Wu et al. ......................... 341/61 |
| 8,606,838 B1 * | 12/2013 | Kenefic et al. ................. 708/313 |
| 8,648,738 B1 * | 2/2014 | Ye et al. .......................... 341/61 |

* cited by examiner

*Primary Examiner* — Brian Young
(74) *Attorney, Agent, or Firm* — Edell, Shapiro & Finnan, LLC (57) ABSTRACT

A communication system including a configurable sample rate converter and a controller is provided. The configurable sample rate converter, configured to convert a digital signal with a first sample rate to a converted signal with a second sample rate, being operable in one of a first configuration and a second configuration. The controller, configured to dynamically control the sample rate converter to operate in one of the first configuration and the second configuration according to at least one condition.

17 Claims, 10 Drawing Sheets

| Operation order of sample rate converter | 3GPP 3G TX QAM EVM | EVM defined by chip manufacturer | 3GPP 3G TX spurious emission at RX band | TX signal output power |
|---|---|---|---|---|
| 2 | ⋮ | <4% | -84dBc | 24dBm |
| ⋮ | ⋮ | ⋮ | -40dBc | -20dBm |
| 1.5 | <14% | ⋮ | -30dBc | -30dBm |
| ⋮ | ⋮ | ⋮ | ⋮ | ⋮ |
| 1 | >14% | <10% | -10dBc | -50dBm |

FIG. 8 ure signal; and FIG. 6(E) depicts a range of a partial circuit for generating a high-order conversion signal.

COMMUNICATION SYSTEM AND SAMPLE RATE CONVERTER THEREOF

This application claims the benefit of U.S. provisional application Ser. No. 61/831,150, filed Jun. 5, 2013, and the benefit of Taiwan application Serial No. 102130468, filed Aug. 26, 2013, the subject matters of which are incorporated herein by reference.

BACKGROUND OF THE INVENTION

1. Field of the Invention

The invention relates in general to a sample rate converter, and more particularly to a sample rate converter capable of adaptively changing an operation configuration thereof.

2. Description of the Related Art

With continual progresses in electronics-related technologies, various kinds of communications apparatuses have become more and more common. Transmitters or receivers in current communication apparatuses frequently include front-end analog circuits and rear-end digital circuits. Between the two circuits with different signal types is provided with a digital-to-analog converter (DAC) or an analog-to-digital converter (ADC).

Figure 1:
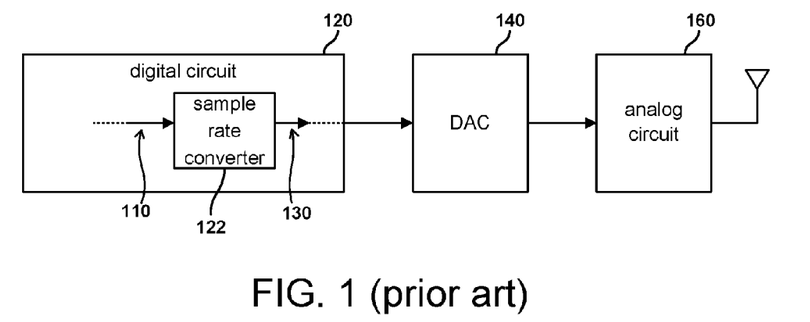
FIG. 1 is a simple function block diagram of transmitter circuits used in a $3^{rd}$-Generatation Partnership Project (3GPP) communication device.

FIG. 1 shows a simple function block diagram of transmitting circuits used in a $3^{rd}$-Generatation Partnership Project (3GPP) communication device. To prevent high-order harmonics of pulses in a digital signal from causing interferences on an analog circuit, the digital circuit 120 and the analog circuit 160 are usually physically spaced by a protection distance for guarding against coupling interference. In addition, to further reduce possible negative influences that the high-order harmonics in the digital pulses pose on the analog circuit 160, a transmission signal 110 first is processed by a sample rate converter 122 before entering a DAC 140. The sample rate of an up-converted signal 130 outputted by the sample rate converter 122 is equal to a quotient of dividing an operation sample rate of the analog circuit 160 by a predetermined integer. In other words, the operation sample rate of the analog circuit 160 is an integral multiple of the sample rate of the up-converted signal 130. Similarly, a digital signal of a 3GPP receiver (not shown) also includes a sample rate converter that down-converts an input signal.

Known to one person skilled in the art, the accuracy of a conversion result of a sample rate converter is related to an order of the converter sample rate. A high-order sample rate converter includes larger quantities of circuit elements and computation procedures to provides more ideal conversion results but to cause greater power consumption. Further, an ambient environment that a communication device encounters usually constantly changes with time. To maintain normal operations in harsh communication environments (e.g., environments with large amounts of noises and interferences), a high-order sample rate converter in a communication device is mostly used. For a mobile communication device, high power consumption caused by a high-order sample rate converter is an unfavorable factor that may shorten a standby period of the mobile communication device.

SUMMARY OF THE INVENTION

To overcome the above issues, the invention is directed to a solution for sample rate conversion. Different from a conventional approach that adopts a sample rate converter with a fixed order, a communication system and a sample rate conversion method according to embodiments of the present invention consider one or multiple conditions and dynamically adjust a configuration of a sample rate converter, so as to change power consumption or other performance indices of the sample rate converter. In a communication environment where a high-quality conversion result is not pursued, the sample rate converter may be configured to operate in a configuration with lower power consumption to save power of the communication system.

According to an embodiment of the present invention, a communication system is provided. The communication system includes a configurable sample rate converter and a controller. The configurable sample rate converter, configured to convert a digital signal with a first sample rate to a converted signal with a second sample rate, being operable in one of a first configuration and a second configuration. The controller, configured to dynamically control the sample rate converter to operate in one of the first configuration and the second configuration according to at least one condition.

According to another embodiment of the present invention, a sample rate conversion method applied in a communication device is provided. The method comprises step a) determining a configuration switching rule of a sample rate conversion procedure according to at least one condition, wherein the sample rate conversion procedure is operable in a first configuration or a second configuration different from the first configuration and step b) switching the sample rate conversion procedure between the first configuration and the second configuration according to the configuration switching rule.

According to yet another embodiment of the present invention, a configurable sample rate converter is provided. The configurable sample rate converter, for converting a digital signal with a first sample rate to a converted signal with a second sample rate, comprises a sample rate conversion circuit and a controller. The sample rate conversion circuit, operable in at least two different configurations. The controller, configured to dynamically control the sample rate conversion circuit to operate in one of the at least two different configurations according to at least one condition.

The above and other aspects of the invention will become better understood with regard to the following detailed description of the preferred but non-limiting embodiments. The following description is made with reference to the accompanying drawings.

DETAILED DESCRIPTION OF THE INVENTION

Figure 2:
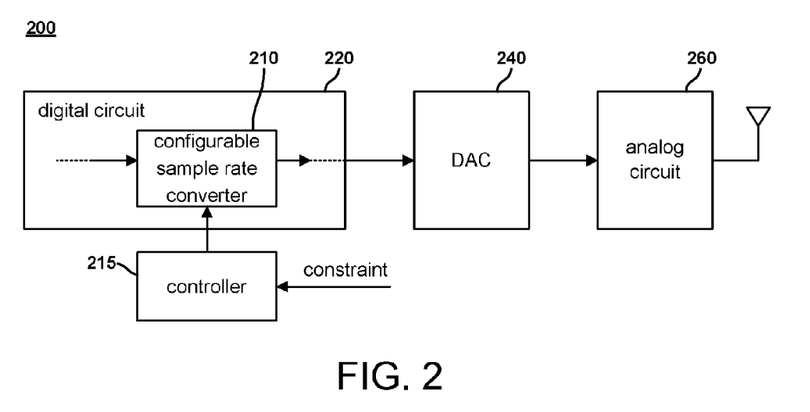
FIG. 2 is a function block diagram of a communication system according to an embodiment of the present invention.

FIG. 2 shows a function block diagram of a communication system according to an embodiment of the present invention. It should be noted that, the term "present invention" refers to an invention concept presented by the embodiments, and the scope thereof is not limited by the described embodiments. Further, unless otherwise specified, the mathematical representations in the disclosure are for explaining principles and logics associated with the embodiments of the present invention, not limiting the present invention.

Referring to FIG. 2, a communication system 200 includes a configurable sample rate converter 210 and a controller 215. In the embodiment, the configurable sample rate converter 210 is included in a digital circuit 220, and is used for converting a digital signal with an input sample rate $F_{IN}$ to a converted signal with an output sample rate $F_{OUT}$. The converted signal is sequentially provided to a digital-to-analog converter (DAC) 240 and an analog circuit 260, in a way that an operation sample rate of the analog circuit 260 is an integral multiple of the sample rate of the converted signal, thereby reducing interferences that digital pulses pose on the analog circuit 260.

The configurable sample rate converter 210 is operated in at least two different configurations. For example, the configurable sample rate converter 210 may be designed to have different operation orders in two different configurations. Alternatively, the configurable sample rate converter 210 may be designed to have the same operation order in two different configurations, but have different computation complexities. In general, a sample rate conversion that operates on a higher operation order or has higher complexities causes high power consuming. Details for changing the configuration of the configurable sample rate converter 210 are to be described shortly. In the description below, a situation where the configurable sample rate converter 210 has different operation orders in a first configuration and a second configuration is given for explaining the present invention, not limiting the present invention. Further, with the description below, one person skilled in the art can easily understand that the scope of the present invention is not limited to an application where the number of configurations of the configurable sample rate converter 210 is two.

Figure 3:
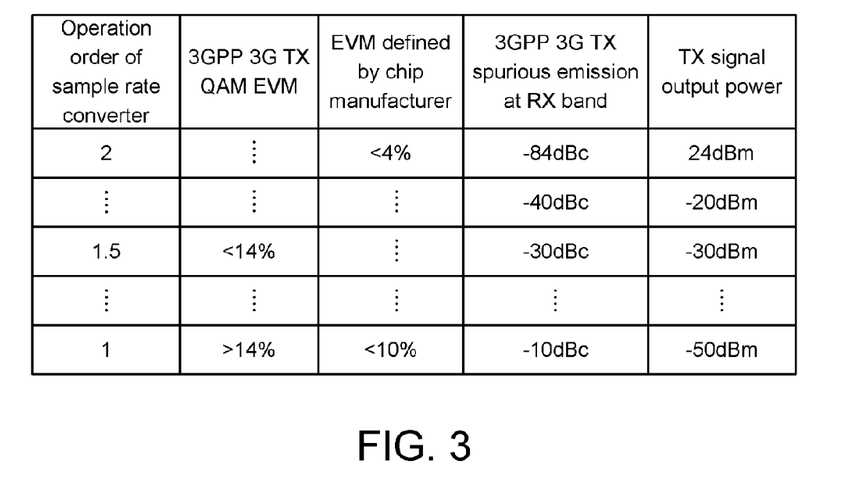
FIG. 3 is an example of a corresponding relationship between operation orders of a sample rate converter and several conditions.

In practice, the controller 215 may be disposed inside the digital circuit 220, or may be provided as an independent unit outside the digital circuit 220 as shown in FIG. 2. The controller 215 dynamically controls the configurable sample rate converter 210 to operate in the first configuration or the second configuration according to at least one condition. For example, the conditions provided to the controller 215 may include the transmitter quality and transmission channel quality measured by the communication system 200, and/or associated determinations generated related to the receiving quality, e.g., error vector magnitude (EVM), adjacent channel leakage power ratio (ACLR), transmitter (TX) spurious emission at receiver (RX) band, and/or transmitter (TX) signal output power. FIG. 3 shows an exemplary corresponding relationship between operation orders of the configurable sample rate converter 210 and several conditions. As shown in the table, when the EVM requirement is lower, the TX spurious emission at RX band is lower and/or the signal output power is lower, the controller 215 may render the sample rate converter 215 to operate in a configuration with a lower order. In short, the configurable sample rate converter 210 need not operate in a high-order configuration having higher power consumption when a communication environment quality is better. Conversely, when the communication environment quality is worse, the configurable sample rate converter 210 may be switched to operate in a high-order configuration to provide better performance. Thus, without degrading overall operation performance of the communication system 200, average power consumption of the configurable sample rate converter 210 can be reduced.

Further, the conditions provided to the controller 215 may also include constraints of the communication system 200, e.g., a power status of the communication system 200. For example, when the controller 215 discovers that the remaining power capacity of the communication system 200 is lower than a threshold, the configurable sample rate converter 210 originally operating in a configuration with higher power consumption may be switched to another configuration with lower power consumption to thereby prolong the usable period of the communication system 200. Methods for generating the foregoing conditions are known to one person skilled in the art, and shall be omitted herein.

In practice, the controller 215 may determine a configuration switching rule of the configurable sample rate converter 210 through a look-up table (LUT) or a logic computation circuit. Taking the table in FIG. 3 for example, the controller 215 may identify a corresponding operation order by using a condition as an index, and determines how to switch the configurable sample rate converter 210 according to a result identified. It should be noted that, the values in the corresponding relationship may be determined by a circuit designer for the communication system 200 according to practical experiences, and is not limited to the examples in FIG. 3. One person skilled in the art can understand that the corresponding relationship and logic rules according to which the controller 215 selects the order may be implemented by circuits of elements such as comparators and logic gates, or be written as non-transient computer-readable media stored to a memory that collaborates with the controller 215.

When multiple conditions are to be considered at the same time, the controller 215 may identify respective corresponding operation orders according to the conditions, and select a maximum among the multiple operation orders identified as a final selected operation order. In other words, for the configurable sample rate converter 210, the controller 215 may determine a first order according to a first condition and a second order according to a second condition, and determine the configuration switching rule of the configurable sample rate converter 210 according to the larger one of the first order and the second order.

Figure 4A:
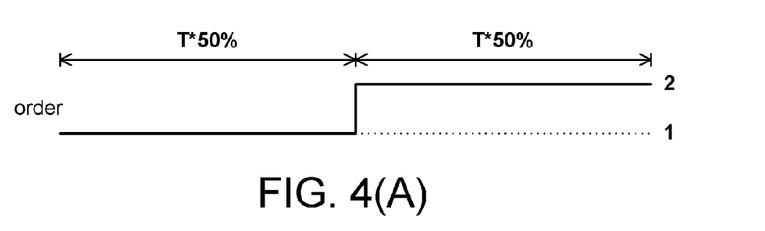
FIGS. 4(A) and FIG. 4(B) are exemplary configuration switching methods adopted by a sample rate converter according to the present invention.
Figure 4B:
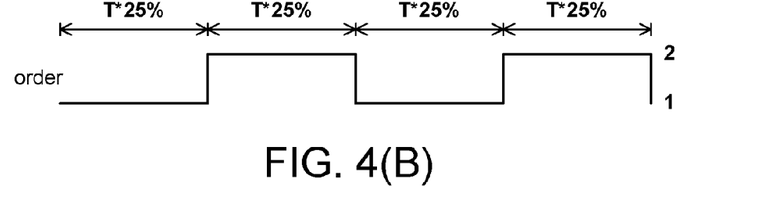

In an embodiment of the present invention, the operation order that the controller selects for the sample rate converter may be an integer, or a non-integer. Assume that the corresponding operation order of the configurable sample rate converter 210 in the first configuration is a positive integer N, and the corresponding operation order of the configurable sample rate converter 210 in the second configuration 210 is another positive integer M. In an embodiment, the operation order that the controller 215 selects for the configurable sample rate converter 210 is between the first operation order N and the second operation order M. For example, assume that N is equal to 1 and M is equal to 2, when the operation order that the controller 215 selects for the configurable sample rate converter 210 is 1.5, the controller 215 may render the configurable sample rate converter 210 to periodically switch and alternate between the first configuration and the second configuration, and render the operations in the first configuration and the second configuration to respectively occupy 50% of the total operation time. As shown in FIG. 4(A), the controller 215 may render the configurable sample rate converter 210 to operate in the first configuration in the first 50% of the time within a predetermined period T, and to operate in the second configuration in the second 50% of the time. Alternatively, referring to FIG. 4(B), the controller 215 may divide the time in which the configurable sample rate converter 210 operates in the first configuration and the second configuration to two T*25%, respectively. Similarly, assume that N is equal to 1 and M is equal to 3, the configurable sample rate converter 210 is rendered to periodically switch and alternate between the first configuration and the second configuration that respectively occupy 50% of the operation time, which is in equivalence rendering the operation order of the configurable sample rate converter 210 to be 2.

In one embodiment, when the controller 215 realizes a predetermined operation order by switching and alternating the configurable sample rate converter 210 between two configurations, the controller 215 plans a time distribution method for switching the configurable sample rate converter 210 between the first configuration and the second configuration by utilizing a delta-sigma modulation procedure or a pulse-width modulation procedure. It is known from the above description that, given a modulation method of a predetermined operation order is achieved by employing a converter configuration having different operation orders, the scope of the present invention does not limit the modulation method. Thus, noises generated from switching the configuration may be relocated to a bandwidth that less likely interferes with the analog circuit 260.

Figure 5A:
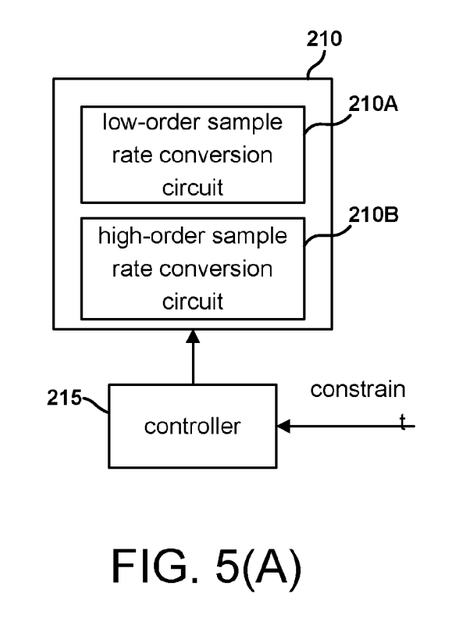
FIGS. 5(A) and FIG. 5(B) are exemplary internal circuit arrangements of a sample rate converter according to the present invention.

As shown in FIG. 5(A), in one embodiment, the configurable sample rate converter 210 includes a low-order sample rate conversion circuit 210A and a high-order sample rate conversion circuit 210B. When the configurable sample rate converter 210 operates in a low-order configuration, the low-order sample rate conversion circuit 210A is activated. When the configurable sample rate converter 210 operates in a high-order configuration, the high-order sample rate conversion circuit 210B is activated. The high-order sample rate conversion circuit 210B may be turned off when the low-order sample rate conversion circuit 210A is activated to save power. Similarly, the low-order sample rate conversion circuit 210A may be turned off when the high-order sample rate conversion circuit 210B is activated.

Figure 5B:
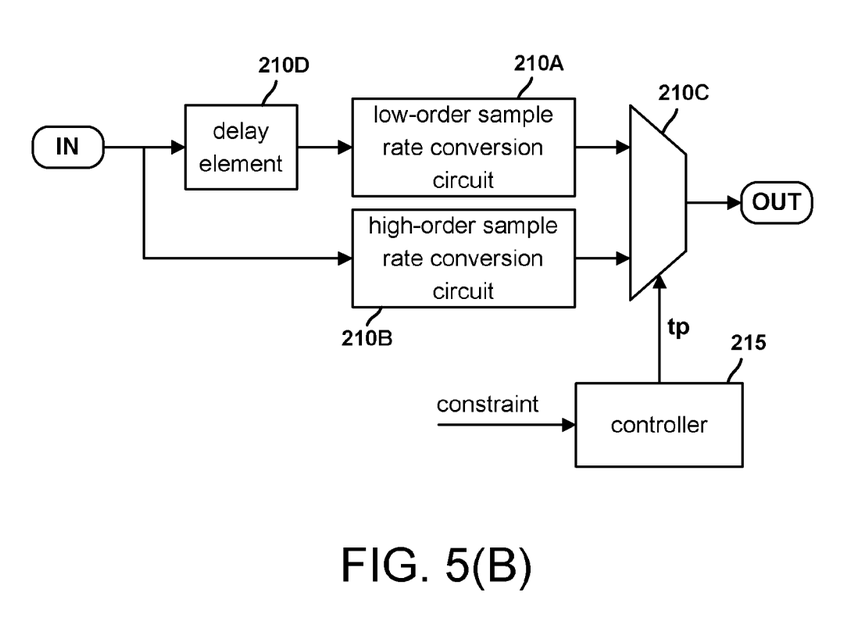

FIG. 5(B) shows a detailed exemplary embodiment of the configurable sample rate converter 210 show in FIG. 5(A). In the example, a switching signal tp generated by the controller 215 is for controlling a multiplexer 210C to select one of an output signal of the low-order sample rate conversion circuit 210A and an output signal of the high-order sample rate conversion circuit 210B as an output signal to be provided to an output terminal OUT of the configurable sample rate converter 210. Known by one skilled person in the art, compared to a low-order sample rate conversion circuit, a high-order sample rate conversion circuit requires a greater number of sets of input data to perform computations and to thus generate its output signal. To achieve a seamless effect, a delay element 210D is provided between the low-order sample rate conversion circuit 210A and an input terminal IN. Assuming that the operation order of the low-order sample rate conversion circuit 210A is equal to 1, the operation order of the high-order sample rate conversion circuit 210B is equal to 2, and the input sample rate $F_{IN}$ is 10 MHz, the delay time provided by the delay element 210D is approximately equal to 0.1 ms, which is a reciprocal of a product of multiplying an input displacement difference between the circuits 210A and 210B by the input sample rate $F_{IN}$. In this example, the input displacement difference between the two-order converter and the one-order converter is one. As such, the output signals respectively outputted by the low-order sample rate conversion circuit 210A and the high-order sample rate conversion circuit 210B may be corresponded to the same input signal. Further, to ensure that the glitch is not caused at the output terminal OUT due to the status change in the switching signal tp, the controller 215 may be designed to arrange a status change time point of the switching signal tp to be synchronous to a status change time point of a clock signal for one of an input sample rate $F_{IN}$ of the sample rate converter and an output sample rate $F_{OUT}$ of the sample rate converter.

Figure 6A:
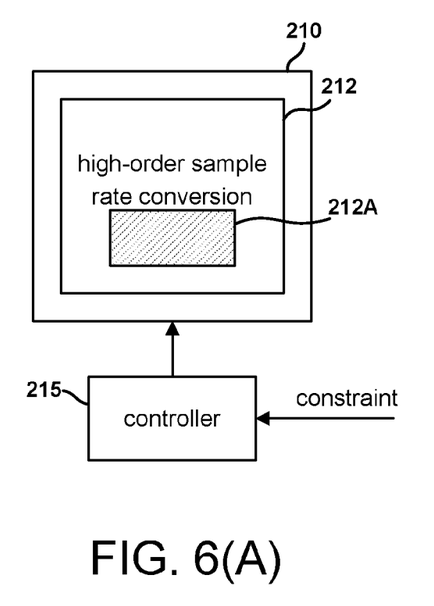
FIG. 6(A) is another exemplary internal circuit arrangement of a sample rate converter according to the present invention.

As shown in FIG. 6(A), in another embodiment, the configurable sample rate converter 210 includes a high-order sample rate conversion circuit 212. When the configurable sample rate converter 210 operates in the low-order configuration, a partial circuit 212A of the high-order sample rate conversion circuit 212 is applied to generate a low-order conversion result. Theoretically, the quantity of elements (e.g., multipliers, delay elements, adders, subtractors . . . ) forming a high-order sample rate conversion circuit is greater than the quantity of elements forming a low-order sample rate conversion circuit. Therefore, by appropriately selecting circuit elements and applying a multiplexer, a high-order sample rate conversion circuit may also provide a low-order conversion result, which is in equivalence embedding a low-order sample rate conversion circuit into a high-order sample rate conversion circuit. When the configurable sample rate converter 210 operates in a high-order configuration, the multiplexer in the high-order sample rate conversion circuit is controlled to output a high-order conversion result.

Figure 6B:
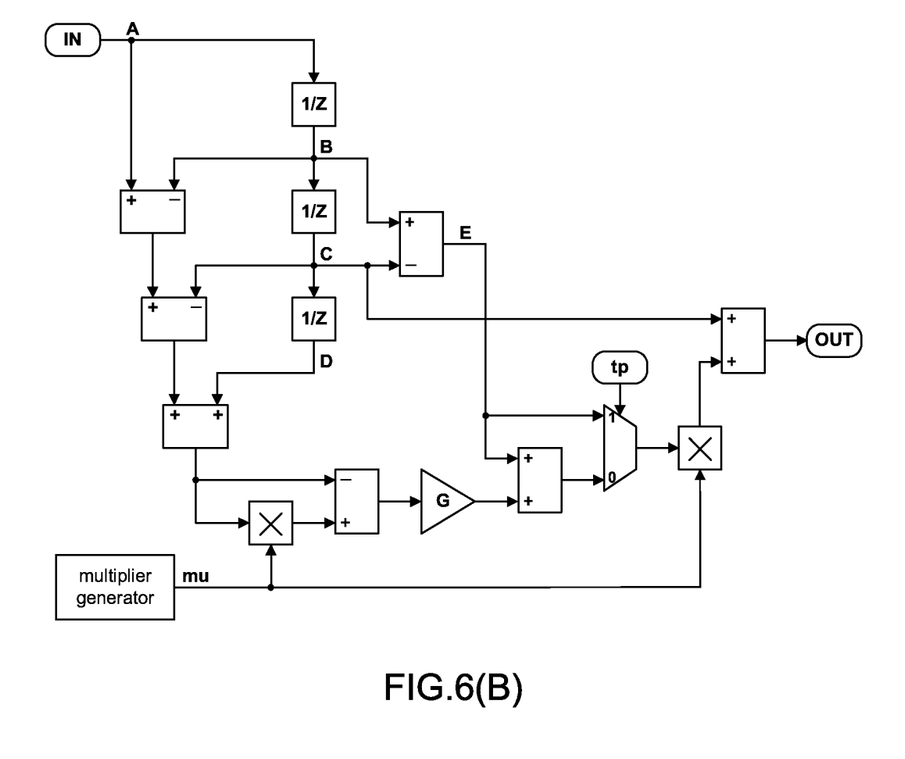
FIG. 6(B) is a detailed exemplary embodiment of the sample rate converter.
Figure 6C:
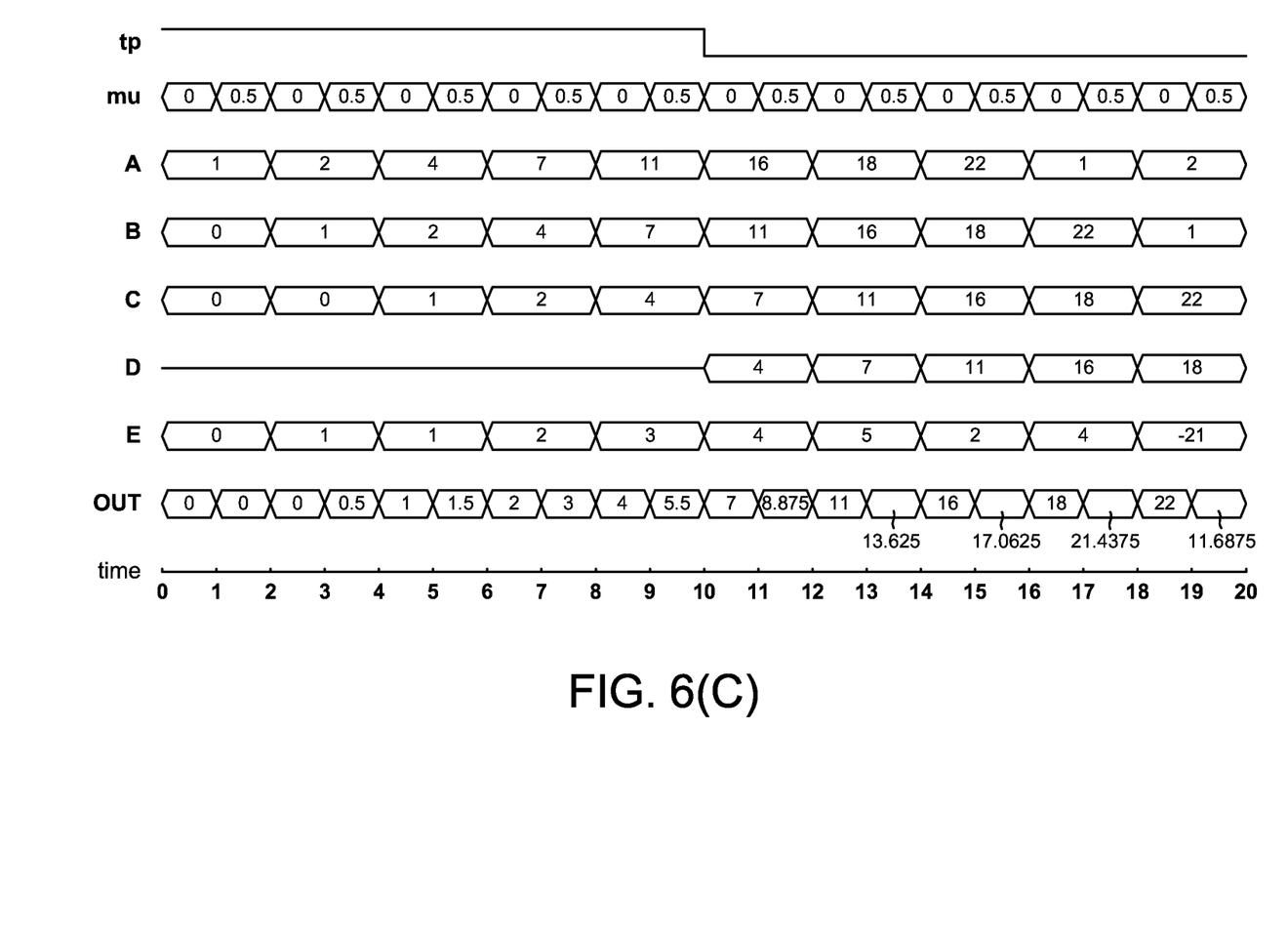
FIG. 6(C) is an exemplary signal timing diagram of the sample rate converter.
Figure 6D:
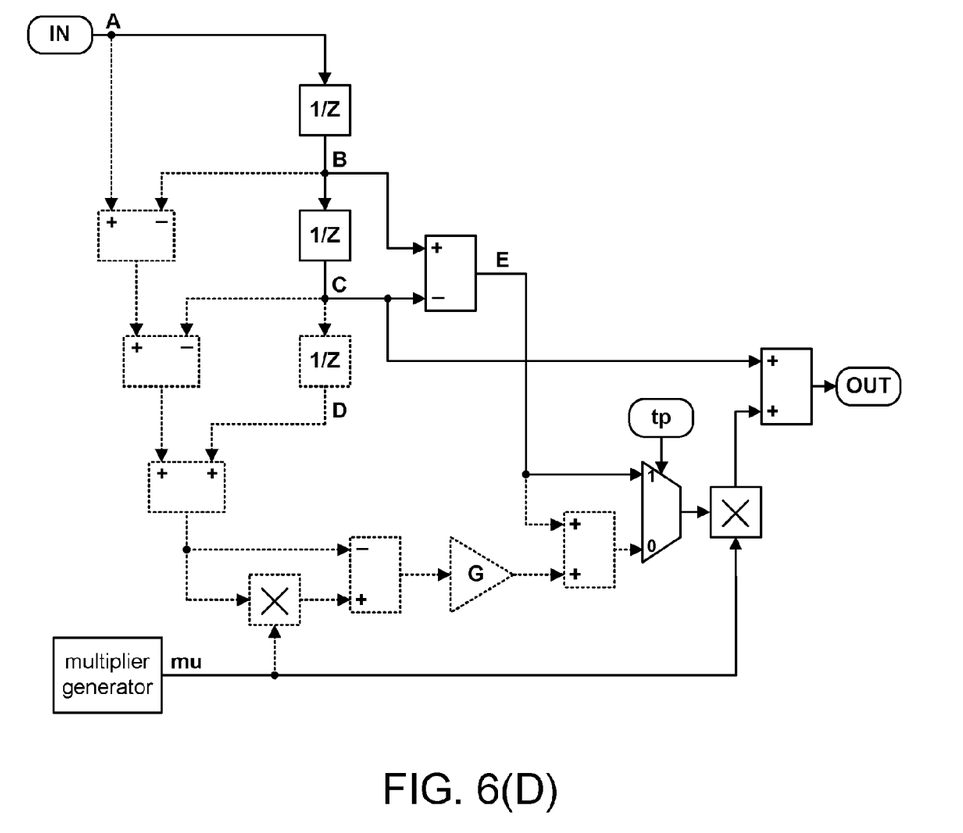
FIG. 6(D) depicts a range of a partial circuit for generating a low-order conversion result.
Figure 6E:
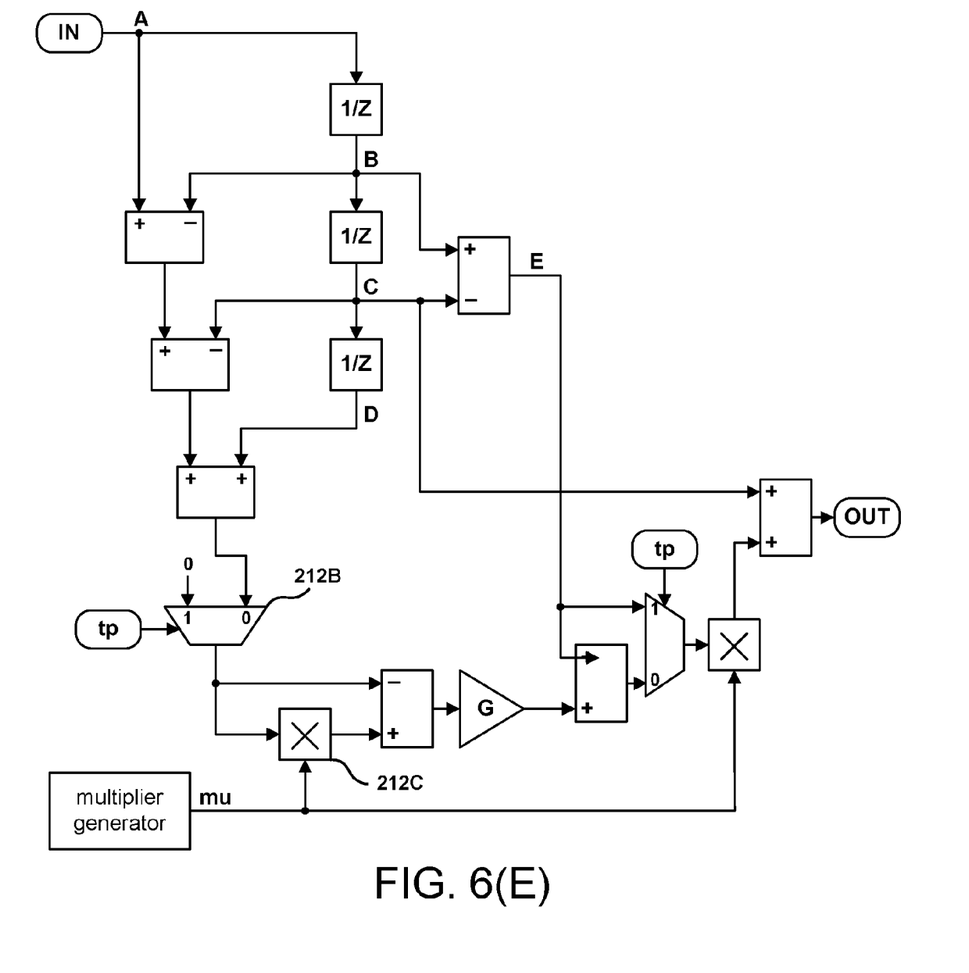
FIG. 6(E) is an exemplary embodiment in which a multiplier is turned off in a low-order configuration.

FIG. 6(B) shows a detailed exemplary embodiment of the high-order sample rate conversion circuit 212; FIG. 6(C) shows an exemplary signal timing diagram of the sample rate conversion circuit. When the switching signal tp is 1, the output terminal OUT provides a first-order conversion result; when the switching signal tp is 0, the output terminal OUT provides a second-order conversion result. In FIG. 6(D), circuit elements included in the partial circuit 212A are represented by solid lines or solid frames, and circuit elements outside the partial circuit 212A are represented by dotted line or dotted frames. In one embodiment, when the configurable sample rate converter 210 operates in a low-order configuration, circuit elements outside the partial circuit 212A, i.e., circuit elements that are not required for generating a low-order conversion result, may be partially or entirely turned off to reduce power consumption.

In practice, a multiplier implemented by a combinational logic element is quite power consuming. FIG. 6(B) shows an exemplary embodiment in which a multiplier 212C is turned off via a multiplexer 212B to reduce power consumption in a first-order configuration.

It should be noted that, in FIG. 6(B), a delay element having an input signal A and an output signal B may be equivalently regarded as the delay element 210D in FIG. 5(B). Thus, the sample rate conversion circuit in FIG. 6(B) may similarly achieve the foregoing seamless effect. Further, by arranging the status change time point of the switching signal tp to be synchronous to the status change time point of the clock signal of the input sample rate $F_{IN}$ or the output sample rate $F_{OUT}$, it is ensure that glitch due to the status change of the switching signal tp is not caused at the output terminal OUT in FIG. 6(B).

Figure 7:
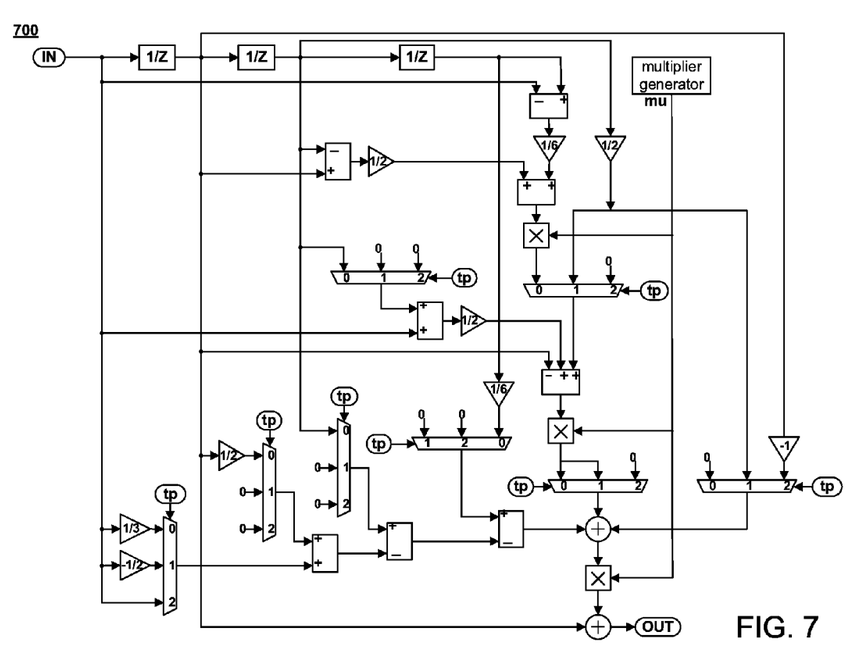
FIG. 7 is another exemplary internal circuit arrangement of a sample rate converter according to the present invention.

FIG. 7 shows a detailed exemplary embodiment of another sample rate conversion circuit according to the present invention. A switching signal tp that is to be provided to the sample rate conversion circuit 700 and for controlling multiplexers is dynamically adjusted by a controller (not shown) according to at least one condition. When the switching signal tp is 2, the output terminal OUT provides a first-order conversion result; when the switching signal is 1, the output terminal OUT provides a second-order conversion result; when the switching signal tp is 0, the output terminal OUT provides a third-order conversion result. Similarly, when the sample rate conversion circuit 700 operates in the low-order configuration, elements irrelevant to operations of the low-order configuration (e.g., a multiplier implemented by a combinational logic element) may be selectively turned off to save overall power consumption of the sample rate conversion circuit 700. In the example, an input displacement difference between the third-order converter and the first-order converter is 2, and the input displacement difference between the second-order converter and the first-order converter is 1. As such, the output signals that the low-order sample rate conversion circuit and the high-order sample rate conversion circuit output at the same time may correspond to the same input signal. It is demonstrated by this embodiment that, the number of configurations adopted by the sample rate conversion circuit is not limited to two.

Figure 8:
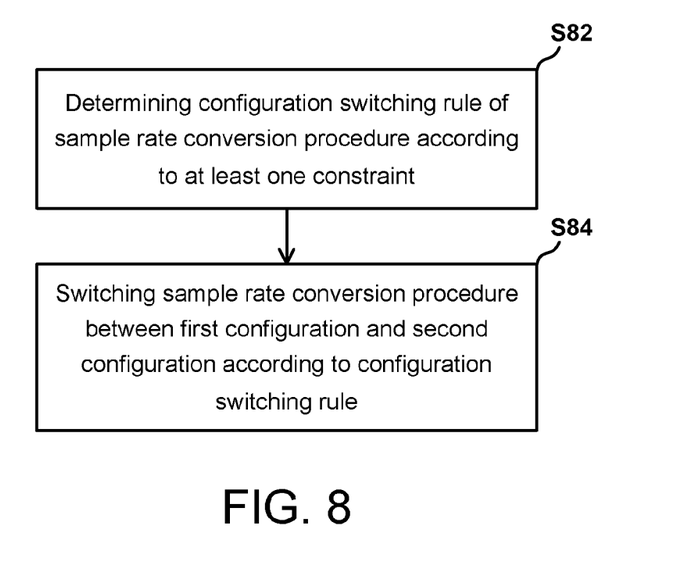
FIG. 8 is a flowchart of a sample rate conversion method according to an embodiment of the present invention.

FIG. 8 shows a flowchart of a sample rate conversion method applied in a communication system according to another embodiment of the present invention. A sample rate conversion procedure is operable in at least two different configurations. In step S82, a configuration switching rule of the sample rate conversion procedure is determined according to at least one condition. In step S84, the sample rate conversion procedure is switched between the at least two different configurations according to the configuration switching rule. Details of the operations and variations (e.g., the types of the conditions and the methods for generating the configuration switching rule) in the description associated with the communication system in FIG. 2 are applicable to the sample rate conversion method, and shall be omitted herein.

It should be noted that, the scope of the present invention is not limited to a transmitter in a communication system or to a 3GPP communication device. For example, the configurable sample rate convertor 210 and the controller 215 may also be disposed at a receiver of a communication device, and dynamically adjust a circuit configuration of down-conversion according to the conditions such as transmitter quality, transmission channel quality and/or receiver quality. Further, the concept of the present invention may also be applied to other types of electronic devices that need sample rate conversion, e.g., an image processing system that requires interpolation for generating a greater number of pixels for expanding an image size, or an image processing system that needs to perform a decimation procedure on multiple sets of pixel data to reduce an image size. A sample rate conversion configuration with a higher operation order is capable of providing an image processing result with a better quality, and a sample rate conversion configuration with a lower operation order is capable of providing a higher image processing speed and lower power consumption.

A solution for sample rate conversion is provided by the disclosed embodiments of the present invention. Different from a conventional approach that adopts a sample rate converter with a fixed order, a communication system and a sample rate conversion method according to the embodiments of the present invention consider one or multiple conditions and dynamically adjust a configuration of a sample rate converter, so as to change power consumption or other performance indices of the sample rate converter. In a communication environment where a high-quality conversion result is not pursued, the sample rate converter may be configured to operate in a configuration with lower power consumption to save power of the communication system.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A communication system, comprising:
  a configurable sample rate converter, configured to convert a digital signal with a first sample rate to a converted signal with a second sample rate, being operable in one of a first configuration and a second configuration; and
  a controller, configured to dynamically control the sample rate converter to operate in one of the first configuration and the second configuration according to at least one condition,
  wherein the at least one condition is one or multiple of an error vector magnitude (EMV), an adjacent channel leakage power ratio (ACLR), a transmitter (TX) spurious emission at receiver (RX) band, a transmitter signal output power, and a power status.

2. The communication system according to claim 1, wherein the controller determines a configuration switching rule of the sample rate converter through a look-up table or a logic computation circuit according to the at least one condition.

3. The communication system according to claim 1, wherein the at least one condition comprises a first condition and a second condition; the controller determines a first order for the sample rate converter according to the first condition and a second order for the sample rate converter according to the second condition, and determines a configuration switching rule of the sample rate converter according to a larger one of the first order and the second order.

4. The communication system according to claim 1, wherein the first configuration corresponds to a first operation order N, the second configuration corresponds to a second operation order M, and N and M are different integers; the controller determines an operation order according to the at least one condition, and the operation order is between the first operation order N and the second operation order M; the controller dynamically controls the sample rate converter to operate in one of the first configuration and the second configuration according to the operation order.

5. The communication system according to claim 4, wherein the controller determines a configuration switching rule of the sample rate conversion by utilizing one of a delta-sigma modulation procedure and a pulse-width modulation procedure.

6. The communication system according to claim 1, wherein the sample rate converter comprises a low-order sample rate conversion circuit and a high-order sample rate conversion circuit; when the sample rate converter operates in the first configuration, the low-order sample rate conversion circuit is activated; when the sample rate converter operates in the second configuration, the high-order sample rate conversion circuit is activated.

7. The communication system according to claim 6, wherein the sample rate converter further comprises a delay element, the delay element is disposed between an input terminal of the sample rate converter and the low-order sample rate conversion circuit, and a delay time length provided by the delay element is associated with the sample rate and is also associated with a sample point displacement difference between the low-order sample rate conversion circuit and the high-order sample rate conversion circuit.

8. The communication system according to claim 7, wherein the controller generates a switching signal to control the sample rate converter operating on one of the first sample rate and the second sample rate, and the switch signal is synchronous to a clock signal for one of an input sample rate of the sample rate converter and an output sample rate of the sample rate converter.

9. The communication system according to claim 1, wherein the sample rate converter comprises a high-order sample rate conversion circuit; when the sample rate converter operates in the first configuration, a partial circuit in the high-order sample rate conversion circuit is utilized to generate a low-order conversion result; when the sample rate converter operates in the second configuration, the high-order sample rate conversion circuit is utilized to generate a high-order conversion result.

10. The communication system according to claim 9, wherein the high-order sample rate conversion circuit comprises a delay element, the delay element is disposed between an input terminal of the sample rate converter and the partial circuit, and the delay element provides a delay time associated with the sample rate and a sample point displacement difference between the first configuration and the second configuration.

11. The communication system according to claim 9, wherein when the sample rate converter operates in the first configuration, a multiplier inside the high-order sample rate conversion circuit and outside the partial circuit is turned off.

12. A sample rate conversion method applied in a communication system, comprising:
a) determining a configuration switching rule of a sample rate conversion procedure according to at least one condition, wherein the sample rate conversion procedure is operable in a first configuration or a second configuration different from the first configuration; and
b) switching the sample rate conversion procedure between the first configuration and the second configuration according to the configuration switching rule,
wherein the at least one condition is one or multiple of an error vector magnitude (EMV), an adjacent channel leakage power ratio (ACLR), a transmitter (TX) spurious emission at receiver (RX) band, a transmitter signal output power, and a power status.

13. The sample rate conversion method according to claim 12, wherein step (a) comprises utilizing the at least one condition as input data, and determining the configuration switching rule of the sample rate converter through a look-up table or a logic computation.

14. The sample rate conversion method according to claim 12, wherein the at least one condition comprises a first condition and a second condition, and step (a) comprises:
determining a first order for the sample rate conversion procedure according to the first condition;
determining a second order for the sample rate conversion procedure according to the second condition; and
determining the configuration switching rule according to a larger one between the first order and the second order.

15. The sample rate conversion method according to claim 12, wherein the first configuration corresponds to a first operation order N, the second configuration corresponds to a second operation order M, and N and M are different integers; an operation order corresponding to the configuration switching rule is between the first operation order N and the second operation order M; step (b) comprises:
determining an operation order according to the at least one condition, the order being between the first operation order N and the second operation order M; and
dynamically controlling the sample rate conversion procedure to operate in one of the first configuration and the second configuration according to the operation order.

16. The sample rate conversion method according to claim 15, wherein step (b) comprises determining the configuration switching rule by utilizing a delta-sigma modulation procedure or a pulse-width modulation procedure.

17. A communication system, comprising:
a configurable sample rate converter, configured to convert a digital signal with a first sample rate to a converted signal with a second sample rate, being operable in one of a first configuration and a second configuration; and
a controller, configured to dynamically control the sample rate converter to operate in one of the first configuration and the second configuration according to at least one condition,
wherein the sample rate converter comprises a low-order sample rate conversion circuit and a high-order sample rate conversion circuit; when the sample rate converter operates in the first configuration, the low-order sample rate conversion circuit is activated; when the sample rate converter operates in the second configuration, the high-order sample rate conversion circuit is activated.

* * * * *